(12) United States Patent
Thayer

(10) Patent No.: US 7,656,727 B2
(45) Date of Patent: Feb. 2, 2010

(54) SEMICONDUCTOR MEMORY DEVICE AND SYSTEM PROVIDING SPARE MEMORY LOCATIONS

(75) Inventor: Larry J. Thayer, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 352 days.

(21) Appl. No.: 11/739,875

(22) Filed: Apr. 25, 2007

(65) Prior Publication Data

US 2008/0266999 A1 Oct. 30, 2008

(51) Int. Cl.
*G11C 29/00* (2006.01)
(52) U.S. Cl. .................. 365/200; 365/185.09
(58) Field of Classification Search ................. 365/200, 365/185.09, 230.03, 230.06
See application file for complete search history.

(56) References Cited

U.S. PATENT DOCUMENTS

| | | | |
|---|---|---|---|
| 4,254,477 A | 3/1981 | Hsia et al. | |
| 4,658,379 A | 4/1987 | Fujishima et al. | |
| 4,839,864 A | 6/1989 | Fujishima | |
| 5,267,205 A | 11/1993 | Hamada | |
| 5,289,417 A | 2/1994 | Ooishi et al. | |
| 5,396,124 A | 3/1995 | Sawada et al. | |
| 5,504,713 A | 4/1996 | Ooishi et al. | |
| 5,694,359 A | 12/1997 | Park | |
| 5,781,717 A | 7/1998 | Wu et al. | |
| 5,926,421 A | 7/1999 | Choi | |
| 5,982,678 A | 11/1999 | Ooishi et al. | |
| 6,075,732 A | 6/2000 | Ooishi et al. | |
| 6,122,208 A | 9/2000 | Stark | |
| 6,552,950 B2 | 4/2003 | Cho et al. | |
| 6,785,171 B2* | 8/2004 | Lee et al. | 365/200 |
| 6,856,561 B2* | 2/2005 | Kato et al. | 365/200 |
| 7,170,801 B2 | 1/2007 | Lee et al. | |
| 2002/0186588 A1 | 12/2002 | Cho et al. | |
| 2004/0125666 A1 | 7/2004 | Lee et al. | |
| 2005/0204212 A1 | 9/2005 | Noguchi et al. | |
| 2006/0285410 A1 | 12/2006 | Hummler | |

* cited by examiner

*Primary Examiner*—Vu A Le

(57) ABSTRACT

A semiconductor memory device having a plurality of memory locations is presented. The plurality of memory locations includes a plurality of primary memory locations and a plurality of spare memory locations. The device includes an address decoder configured to receive a memory location address and process the address to select one of the memory locations. The device further includes control logic configured to receive control signals and process the control signals to determine whether the selected one of the memory locations is one of the primary memory locations or one of the spare memory locations, and to provide access to the selected one of the memory locations via data lines.

27 Claims, 5 Drawing Sheets

US 7,656,727 B2

SEMICONDUCTOR MEMORY DEVICE AND SYSTEM PROVIDING SPARE MEMORY LOCATIONS

BACKGROUND OF THE INVENTION

A vital component of virtually all computer systems is a semiconductor or solid-state memory system. Such memory often holds both the programming instructions for a processor of the computer system, as well as the data upon which those instructions are executed. In one example, the memory system may include one or more dual in-line memory modules (DIMMs), with each DIMM carrying multiple dynamic random access memory (DRAM) integrated circuits (ICs). Other memory technologies, such as static random access memories (SRAMs), and other memory organizational structures, such as single in-line memory modules (SIMMs), are also employed in a variety of computer systems. In addition, one or more processors may be coupled with the memory modules through a memory controller, which translates data requests from the processor into accesses to the data held in the memory modules.

Computer systems have benefited from the ongoing advances made in both the speed and capacity of memory devices, such as DRAMs, employed in memory systems today. However, increasing memory data error rates often accompany these advancements. More specifically, both "hard errors" (permanent defects in a memory device, such as one or more defective memory cells) and "soft errors" (data errors of a temporary nature, such as inversion of data held within one or more memory cells) tend to become more prevalent with each new technology generation.

Some of these memory defects within individual memory devices are discovered during the manufacturing process by way of test equipment writing multiple data patterns to each of the device memory locations, reading the data back, and comparing the data read with the data written. If the test equipment detects a defective memory location, the device may be discarded. In other cases, the device may incorporate one or more spare memory locations configured to replace the defective memory locations by way of fusible links programmed via the tester so that memory requests for a defective location are instead redirected within the device to an associated spare location. By incorporating spare memory in this fashion, device mortality at the manufacturing site may be greatly reduced.

However, after the memory device is then placed in an operating computer system, both hard and soft errors may still be encountered during normal use of the device. To combat these errors, memory controllers in commercial computer systems now often support an error detection and correction (EDC) scheme in which redundant EDC data is stored along with the customer, or "payload," data. When these data are then read from the memory, the memory controller processes the EDC data and the payload data in an effort to detect and correct at least one data error in the data. The number of errors that may be detected or corrected depends in part on how the nature of the EDC scheme utilized, as well as the amount of EDC data employed compared to the amount of payload data being protected. Typically, the more EDC data being utilized, the higher the number of errors being detected and corrected, but also the higher the amount of memory capacity overhead incurred.

More advanced memory controllers supplement their EDC scheme with a "chipkill" capability, in which the data within an entire memory device, such as a DRAM, may be ignored, or "erased," and then recreated using the EDC data. Such functionality allows an entire device to fail while maintaining the capability to fully recover the data. Further, some memory systems may also provide one or more spare memory devices to be used as replacements for other failing memory devices. However, similar to the use of EDC, the use of spare devices also increases the cost and memory overhead associated with the memory system. Other systems may supply a spare DIMM for replacing an entire in-use DIMM. In yet another example, the memory controller itself may include a small amount of storage to replace one or more memory locations in the memory devices. In other implementations, computer system firmware may report a defect detected by the EDC scheme to an operation system (OS), which may then replace a constant-sized OS-level "page" of memory containing the defect with another memory page previously allocated to the OS.

Even with these advanced memory protection mechanisms, further memory technological advances often involve attendant increases in hard and soft errors rates, thus reducing device reliability. Also, new memory device generations sometimes introduce previously unknown memory failure modes. For example, memory defects previously causing one or two memory cells to fail may instead affect four or eight memory cells. Thus, such advances in memory technology may have the unintended effect of reducing the effectiveness of the EDC and related schemes currently employed in computer memory systems.

DETAILED DESCRIPTION OF THE INVENTION

Figure 1:
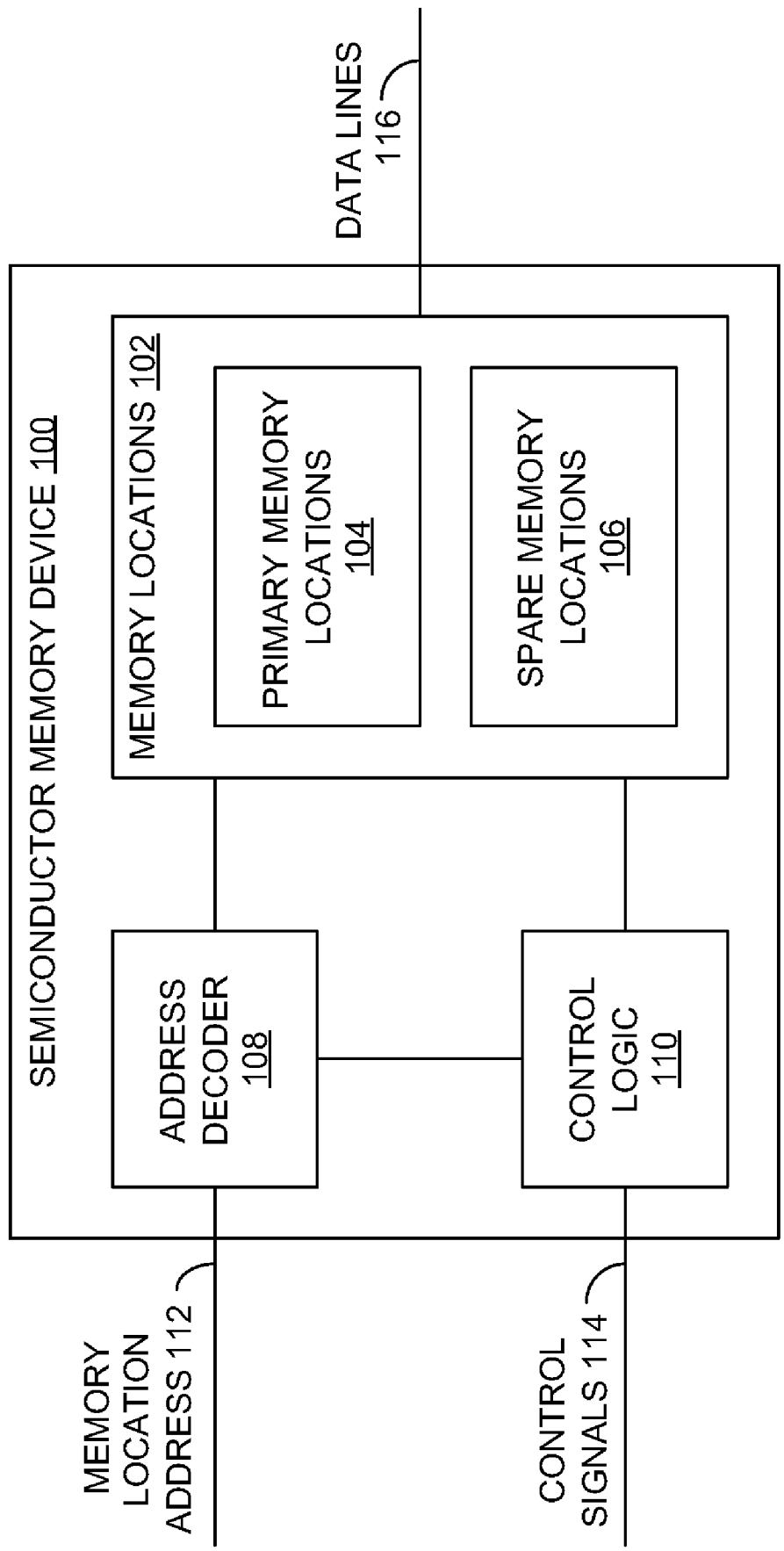
FIG. 1 is a block diagram of a semiconductor memory device according to an embodiment of the invention.

FIG. 1 provides a block diagram of one embodiment of the invention: a semiconductor memory device 100 that includes a plurality of memory locations 102. More specifically, the memory locations 102 include a plurality of primary memory locations 104 and a plurality of spare memory locations 106. Included in the device 100 is an address decoder 108 configured to receive a memory location address 112 and process the address 112 to select one of the memory locations 102. Also provided is control logic 110 configured to receive control signals 114 and process the control signals 114 to determine whether the selected one of the memory locations 102 is one of the primary memory locations 104 or one of the spare memory locations 106. The control logic 110 is also configured to provide access to the selected one of the memory locations 102 via data lines 116. In another embodiment, a memory controller (not shown in FIG. 1) may be employed to generate the memory location address 112 and the control signals 114.

Figure 2:
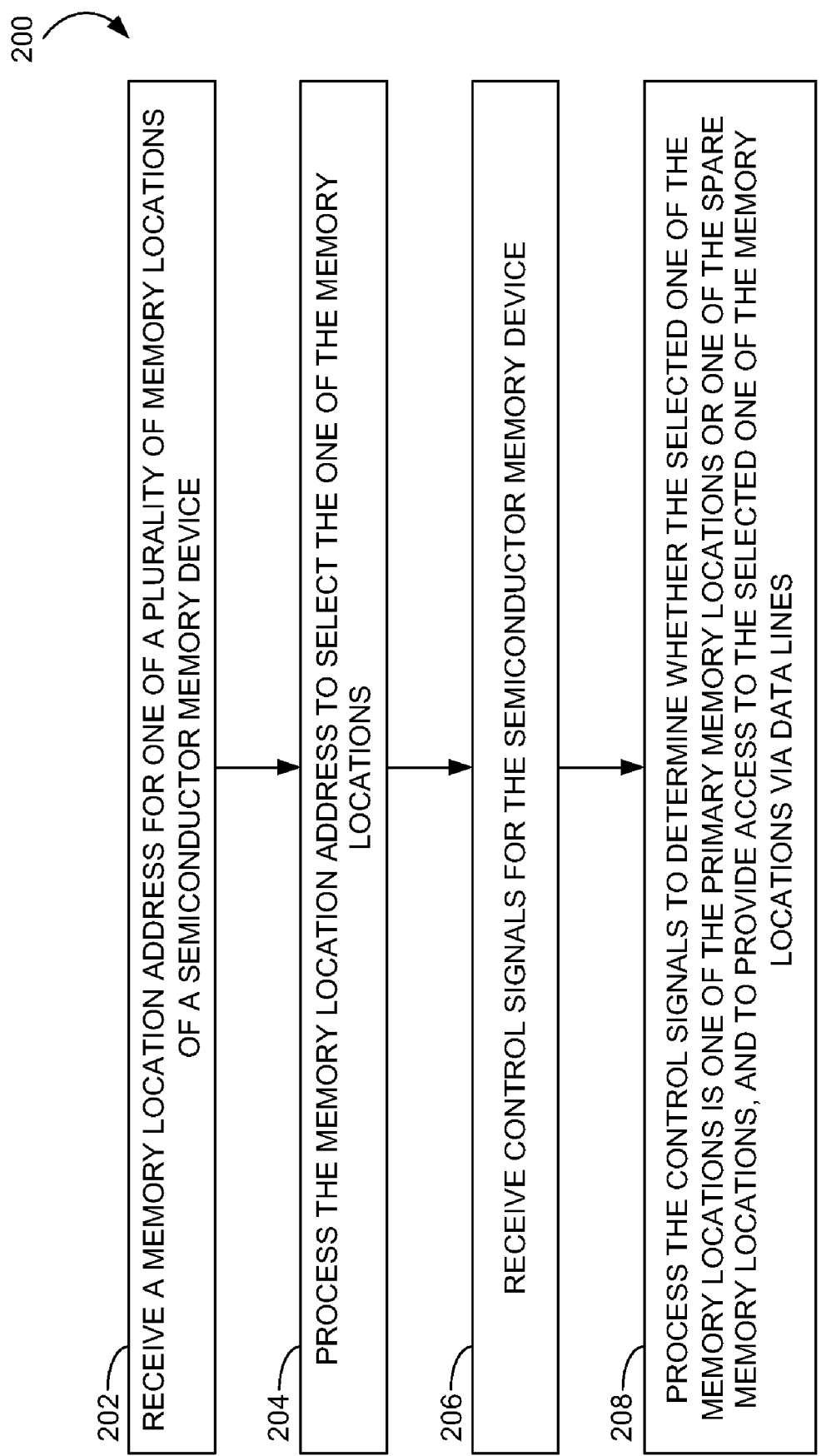
FIG. 2 is flow diagram of a method for accessing a memory location of a semiconductor memory device according to an embodiment of the invention.

Another embodiment of the invention, a method 200 for accessing a memory location of a semiconductor memory device, is presented by way of a flow diagram in FIG. 2. In the method 200, a memory location address is received for one of a plurality of memory locations of the semiconductor memory device (operation 202). The plurality of memory locations includes a plurality of primary memory locations and a plurality of spare memory locations. The memory location address is then processed to select the one of the one of the memory locations (operation 204). Control signals for the device are also received (operation 206), which are then processed (operation 208) to determine whether the selected one of the memory locations is one of the primary memory locations or one of the spare memory locations, and to provide access to the selected one of the memory locations via data lines.

Figure 3:
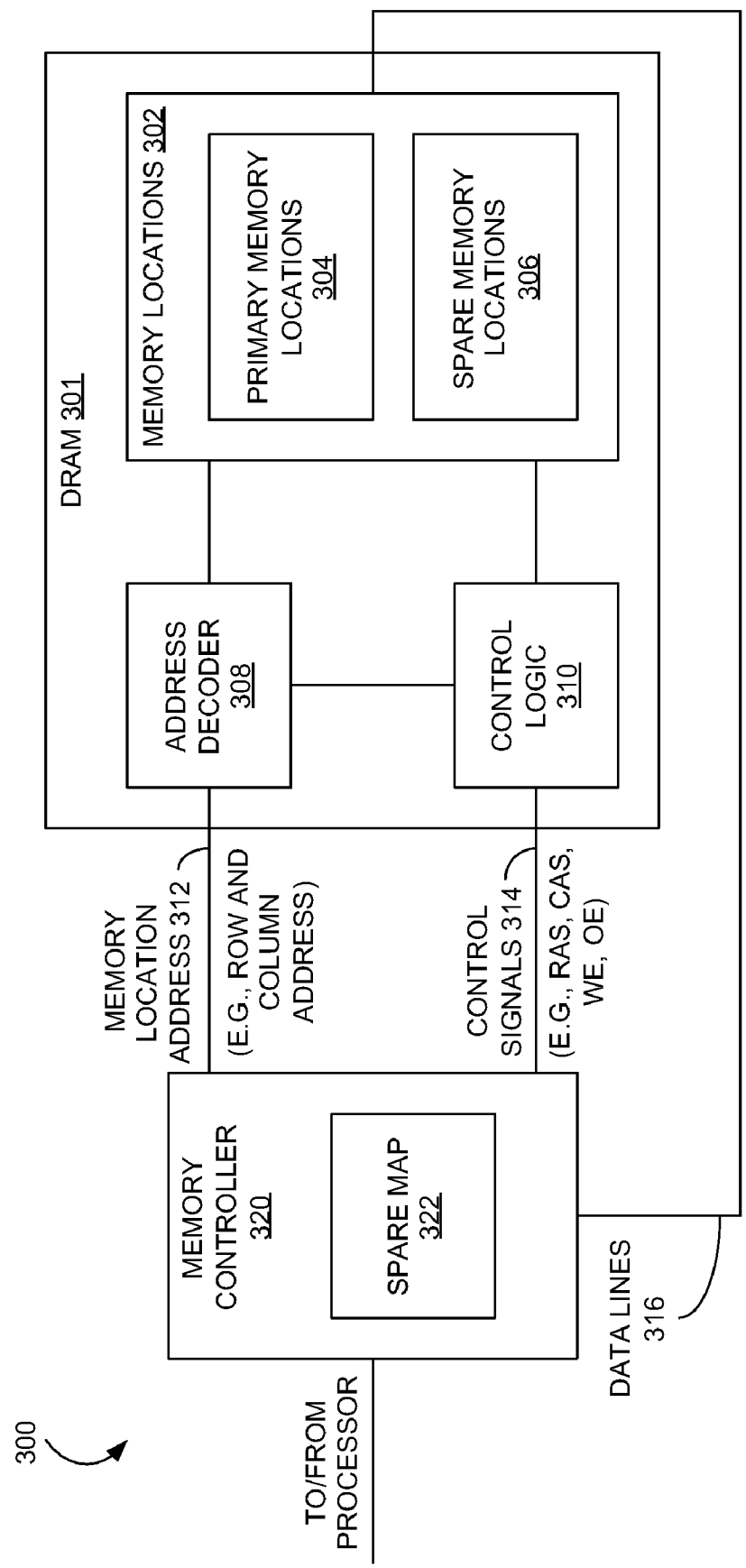
FIG. 3 is a block diagram of a semiconductor memory system according to an embodiment of the invention, including a DRAM device and a memory controller.

FIG. 3 illustrates an embodiment of a semiconductor memory system 300 including a dynamic random access memory (DRAM) 301 coupled with a memory controller 320. The memory controller 320 may in turn be coupled with one or more processors of a computer system. Also, while the memory controller 320 is depicted as being directly connected to the DRAM 301, other components, such as cache memory units, may be coupled between the memory controller 320 and the DRAM 301. In addition, while a single DRAM 301 is shown in the memory system 300, other embodiments may employ several DRAMs 301 as one or more ranks of memory coupled in parallel with the memory controller 320. The DRAM 301 may represent any one of a number of operational types of DRAMs, such as dual-data rate (DDR) DRAMs, extended data-out (EDO) DRAMs, and others.

The DRAM 301 of FIG. 3 includes memory locations 302 organized as primary memory locations 304 and spare memory locations 306. Ordinarily, the primary memory locations 304 act as the main memory locations accessed by the memory controller 320 in the absence of memory defects. The spare memory locations 306 may operate as replacements for one or more of the primary memory locations 304 under the guidance of the memory controller 320, as will be described in greater detail below. Each of the primary memory locations 304 and the spare memory locations 306 is individually addressable by way of the memory location address 312 received from the memory controller 320. Also, each of the memory locations 302 may contain one or more binary digits ("bits") of data storage, depending on the particular embodiment. A typical bit-width for each memory location 302 of the DRAM 301 may be four or eight.

Figure 4:
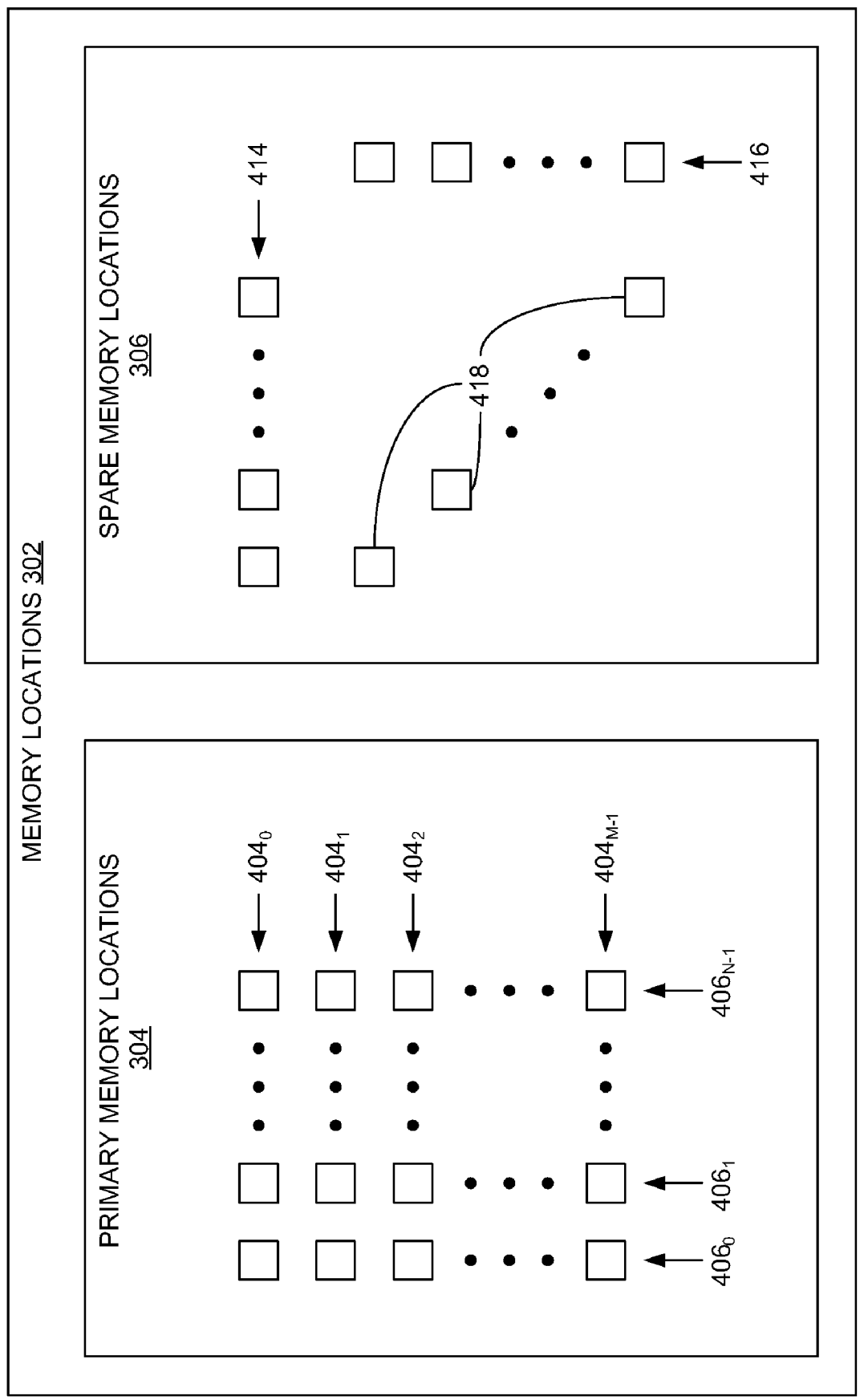
FIG. 4 is a block diagram of primary and spare memory locations of the DRAM of FIG. 3.

A more detailed block diagram of the memory locations 302 is presented in FIG. 4. The primary memory locations 304, each of which are individually addressable by way of the memory location address 312, are organized as a set of M primary memory rows 404 and N primary memory columns 406, resulting in M-times-N individually-addressable primary memory locations 304. Hundreds or thousands of both the rows 404 and the columns 406 may be provided, resulting in thousands or millions of primary memory locations 304. In other embodiments, the primary memory locations 304 may also be organized into separate banks, wherein each bank contains its own rows 404 and columns 406 of the primary locations 304.

Compared to the potentially millions of primary memory locations 304, the spare memory locations 306 of FIG. 3 are typically much fewer in number, and may provide replacement storage for the primary memory locations 304 in any of a number of configurations. In the specific example of FIG. 3, some of the spare locations 306 may be organized as a spare memory row 414 configured to replace a row 404 of the primary memory locations. Also, some spare locations 306 may be configured as a spare memory column 416 for replacing a primary memory column 406. In addition, several spare locations 306 may be organized as single spare locations 418 for replacing individual primary locations 304. Each type of spare location 306 may be tailored for memory defects having a particular scope. For example, some defects, such as faulty individual memory cells, may adversely affect only a single primary location 304. Such defects of restricted scope may be resolved by the use of the single spare locations 418. However, other defects may affect one or more entire rows 404 or columns 406 of the primary locations 304. In such cases, the spare memory row 414 or spare memory column 416 may be employed as a replacement, as appropriate. While the embodiment of FIG. 4 indicates the existence of a single spare row 414, a single spare column 416, and several single spare locations 418, the DRAM 301 may incorporate more or fewer of any of these particular spare memory location 306 configurations in other implementations. For example, multiple spare rows 414 and multiple spare columns 416 may be employed to cover multiple defects, or defects which affect more than one row 404 or column 406. In other embodiments, an entire spare bank may also be provided to replace an entire defective bank of primary memory locations 304. Other possible spare memory location 306 configurations are also possible.

In addition to primary memory locations 304 deemed permanently defective, other primary locations 304 may also be replaced according to the embodiments described herein. For example, one or more cells of a primary memory location 304 may be "weak," and thus unable to maintain its most recently written logic state from time to time. Other cases may exist in which replacement of a primary memory location 304 that is not defective may be desirable.

Also contained in the DRAM 301 is an address decoder 308 and control logic 310. Other functional blocks often found in DRAMs, such as address and data buffers, memory refresh logic, sense amplifiers, and the like, are not shown in FIG. 3 or discussed herein to simplify the discussion of the operation of the DRAM 301.

The address decoder 308 of the DRAM 301 is configured to receive a memory location address 312 from the memory controller 320 and process the memory location address 312 to select one of the memory locations 302. In one embodiment, the address 312 includes a row portion and a column portion separately transmitted by the memory controller 320 to the address decoder 308. The row portion may indicate the row 404 of the desired primary memory location 304, while the column portion may relate the column 406 of the location 304.

The control logic 310 of the DRAM 301 is configured to receive control signals 314 from the memory controller 320. The control logic 310 processes the control signals 314 to provide the memory controller 320 access to the memory location 302 indicated by the memory location address 312. In one embodiment, the control signals 314 may include a row address select signal RAS, a column address select signal CAS, a write enable signal WE, and an output enable signal OE, which may operate in a fashion typical for corresponding signals utilized in conventional DRAMs.

In many situations, the memory controller 320 may operate in a fashion similar to other conventional memory controllers 320. For example, the memory controller 320 generates the memory location address 312 received by the address decoder 308 of the DRAM 301 to select one or more primary memory locations 304 for access. The memory controller 320 also generates the necessary control signals 314, such as the RAS, CAS, WE, and OE signals mentioned above, to access the primary memory locations 304 by way of one or more data lines 316. In one embodiment, the number of data lines 316 is equivalent to the number of storage bits implemented in the DRAM 301 for each of the memory locations 302. In some implementations, the memory controller 320 may also implement the EDC and chipkill schemes mentioned above to reduce or eliminate the effects of memory errors in one or more of the memory locations 302.

Figure 5:
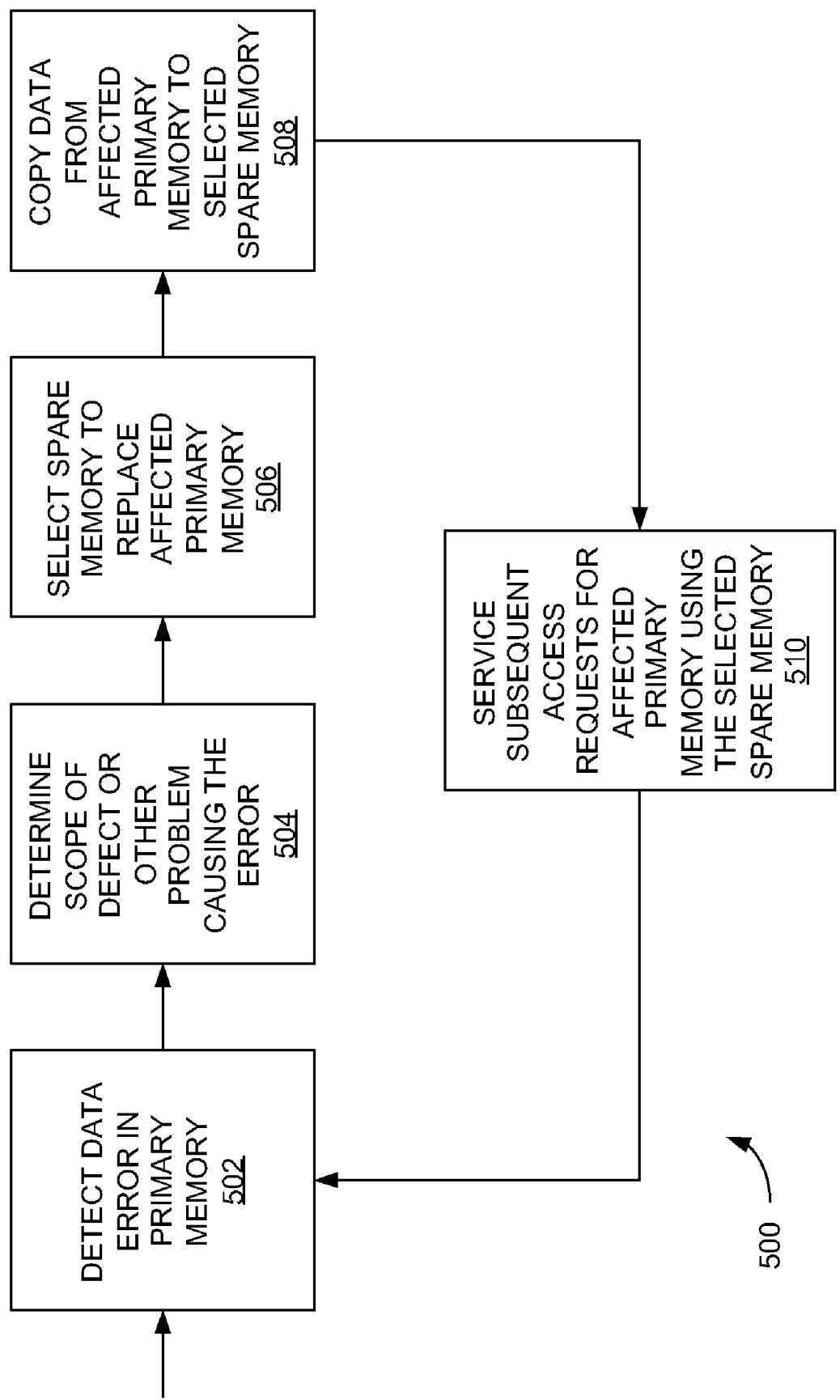
FIG. 5 is a flow diagram of a method of operating the memory controller of FIG. 3.

In the embodiment of FIG. 3, the memory controller 320 also plays a role in employing the spare memory locations 306 as replacements for defective or problematic primary memory locations 304. FIG. 5 provides a simplified block diagram of memory controller 320 operations related to the use of the spare memory locations 306 according to one embodiment of the invention. Other embodiments may include more or fewer operations, and may involve a different ordering of the operations from those indicated in FIG. 5, including concurrent or simultaneous execution of some operations.

During normal read and write operations of the primary memory locations 304 undertaken by the memory controller 320, the memory controller 320 may detect one or more data errors involving one or more of the primary memory locations 304 requiring replacement (operation 502). This error detection (and, likely, correction) may occur by way of one or more EDC schemes employed by the memory controller 320, as discussed earlier.

In one embodiment, the memory controller 320 may also be able to determine or identify a scope or range of each defect or other problem causing the detected data errors (operation 504). For example, the memory controller 320 may be able to determine that a particular set of errors occurring within a particular row 404 or column 406 of the primary memory locations 304 may be caused by a single defect of the DRAM 301. As a result of the determination of scope, the memory controller 320 may select spare memory locations 306 for replacing the affected primary memory locations 304 (operation 506). For example, if the memory controller 320 determines that a particular memory defect only impacts one or a few primary memory locations 304, the memory controller 320 may select an appropriate number of the single spare memory locations 418 as replacements. If, instead, the memory controller 320 determines that one or more entire rows 404 or columns 406 are defective, the memory controller 320 may select one or more spare memory rows 414 or spare memory columns 416 to replace the affected primary memory locations 304, as appropriate. In one embodiment, the memory controller 320 may indicate the selected spare memory locations 306 and their associated affected primary memory locations 304 in a spare map 322 (shown in FIG. 3), which may be a small amount of memory located within, or coupled to, the memory controller 320. The memory controller 320 may also use the spare map 322 to track which spare memory locations 306 have already been assigned as replacements so that the memory controller 320 can determine which of the spare memory locations 320 remain as potential replacements for primary memory location 304 defects or other problems detected in the future.

Once the selection of the spare memory locations 306 has been made, the memory controller 320 may copy data residing in the affected primary memory locations 304 to the selected spare memory locations 306 to facilitate the replacement (operation 508). In one embodiment, the memory controller 320 reads one of the affected primary memory locations 304, corrects any data errors, and writes the corrected data to the corresponding replacement spare memory location 306. In the case multiple primary memory locations 304, such as a row 404 or column 406, are associated with a particular defect or other problem, the memory controller 320 may maintain a pointer indicating which of the affected primary memory locations 304 have been copied over to their replacement locations 306. As a result, the memory controller 320 can determine whether future memory accesses, such as those initiated by a processor, involving the affected locations 304 are to be directed to the affected primary location 304 or its replacement 306 if the copy operation has not been completed. In another example, the memory controller 320 may be configured to write both an affected primary memory location 304 and its associated replacement location 306 in response to a write request from a processor. In that case, the memory controller 320 may continue to service read requests from the affected primary memory locations 304 until the copy operation is complete, at which point the memory controller 304 may then service all subsequent requests utilizing the assigned replacement locations 306 (operation 510).

The memory controller 320 may access the spare memory locations 306 by any of a number of methods. In one embodiment, the memory controller 320 may implement a nonstandard state or states of the control signals 314 (shown in FIG. 3) normally employed by DRAMs for controlling memory access. For example, some combination of the control signals RAS, CAS, WE and OE not normally employed to read or write the primary memory locations 304 of the DRAM 301 may be interpreted by the DRAM 301 to allow a write or read operation of one of the spare memory locations 306. Such a use of the preexisting control signals 314 may allow the sparing functionality described herein without adding to the pin count of DRAM devices currently available. In another embodiment, one or more additional control signals may be provided at the DRAM 301 to request access to the spare memory locations 306 instead of the primary memory locations 304.

To inform the DRAM 301 which of the spare locations 306 is to be accessed, the memory controller 320 may employ the memory location address 312 (depicted in FIG. 3). More specifically, if memory controller 320 employs the control signals 314 to indicate an access for one of the spare memory locations 306, the bits of the memory location address 312 may indicate which of the spare memory locations 306 is to be used. Further, at least one or more of the bits of the memory location address 312 may also indicate the type of spare memory locations 306 to be accessed. For example, one or more bits may indicate whether a spare memory row 414, a spare memory column 416, or a single spare memory location 418 is to be accessed. Assuming the DRAM 301 contains more than one of each of these types of spare memory locations 306, the memory controller 320 may use other bits of the memory location address 312 to indicate which of a particular type of spare memory location 306 is being accessed, as well as which location 306 within a spare row 414 or column 416 is to be written or read. In another embodiment, the memory controller 320 may employ some combination of the memory location address 312 and the control signals 314 to specify this information to the DRAM 301.

In one embodiment of the memory system 300, the memory controller 320 may simultaneously access in parallel multiple DRAMs 301 populating a SIMM or DIMM. Typically, such access allows the storage of wide data words, along with error correction data, at each addressable location of the SIMM or DIMM. To allow the memory controller 320 to replace different primary memory locations 304 in the various DRAMs 301 of the same SIMM or DIMM, the memory controller 320 and the SIMM or DIMM may be configured to drive one or more control signals 314 and/or memory location address 312 bits of each of the DRAMs 301 separately to distinguish one DRAM 301 from another for sparing purposes.

While the memory controller 320 and the DRAM 301 of FIG. 3 generate and receive signals identified with conventional DRAMs, other memory controller/device interfaces may benefit from application of the various embodiments discussed herein. For example, various concepts described herein regarding replacement of primary memory locations with spare memory locations may be applied to fully-buffered DIMMs (FB-DIMMs), which employ a more serialized interface with memory controllers to enhance memory system speed and capacity. Other controller/device configurations may be utilized in other embodiments as well.

Implementation of one or more of the embodiments of the invention as described herein may impart several advantages. For one, with each DRAM or other memory device providing its own memory storage for replacement of primary memory locations, the number of spare memory locations available scales upward with the number of DRAMs employed in the memory system. Also, unlike previous memory systems, the memory devices and controllers presented may operate to replace primary memory locations with spare memory locations within a functional, operating memory system, long after the various components have left the manufacturer. In addition, standardized implementations of one or more embodiments may facilitate the multiple sourcing and corresponding reduced costs currently associated with memory devices and controllers available today.

While several embodiments of the invention have been discussed herein, other embodiments encompassed by the scope of the invention are possible. For example, while many embodiments as described above specifically involve the use of DRAM, other volatile memory device technologies, such as SRAMs, and nonvolatile memory devices, such as flash memory devices, may also benefit from application of various aspects of the invention as described herein. Also, application of the principles outlined herein may apply to many different types of electronic systems, such as general-purpose computer systems, network and communication servers, special-purpose electronic devices, and any other electronic system requiring a memory system. Further, aspects of one embodiment may be combined with those of alternative embodiments to create further implementations of the present invention. Thus, while the present invention has been described in the context of specific embodiments, such descriptions are provided for illustration and not limitation. Accordingly, the proper scope of the present invention is delimited only by the following claims.

What is claimed is:

1. A semiconductor memory device, comprising:
   a plurality of memory locations comprising a plurality of primary memory locations and a plurality of spare memory locations;
   an address decoder configured to receive a memory location address and process the memory location address to select one of the memory locations; and
   control logic configured to receive control signals and process the control signals to determine whether the selected one of the memory locations is one of the primary memory locations or one of the spare memory locations, and to provide access to the selected one of the memory locations via data lines, wherein the control signals are existing control signals in a nonstandard state to provide sparing functionality without adding to pin count of a memory device.

2. The semiconductor memory device of claim 1, wherein: the semiconductor memory device comprises a dynamic random access memory; and the plurality of spare memory locations is configured to replace at least one of individual ones of the primary memory locations, a row of the primary memory locations, a column of the primary memory locations, and a bank of the primary memory locations.

3. The semiconductor memory device of claim 2, wherein the control signals comprise at least one of a row address select signal, a column address select signal, an output enable signal and a write enable signal.

4. The semiconductor memory device of claim 1, wherein the control signals comprise at least one selection signal configured to select between the one of the primary memory locations and the one of the spare memory locations.

5. The semiconductor memory device of claim 1, wherein the address decoder is configured so that if the selected one of the memory locations is one of the spare memory locations, the memory location address identifies the one of the spare memory locations.

6. A semiconductor memory system, comprising:
   a memory controller; and
   a plurality of semiconductor memory devices, wherein each of the semiconductor memory devices comprises:
      a plurality of memory locations comprising a plurality of primary memory locations and a plurality of spare memory locations;
      an address decoder configured to receive a memory location address and process the memory location address to select one of the memory locations; and
      control logic configured to receive control signals and process the control signals to determine whether the selected one of the memory locations is one of the primary memory locations or one of the spare memory locations, and to provide access to the selected one of the memory locations via data lines;
   wherein the memory controller is configured to generate the memory location address and the control signals.

7. The semiconductor memory system of claim 6, wherein:
   each of the semiconductor memory devices comprises a dynamic random access memory; and
   for each of the dynamic random access memories, the plurality of spare memory locations are configured to replace at least one of individual ones of the primary memory locations, a row of the primary memory locations, a column of the primary memory locations, and a bank of the primary memory locations.

8. The semiconductor memory system of claim 7, wherein the control signals comprise at least one of a row address select signal, a column address select signal, an output enable signal and a write enable signal.

9. The semiconductor memory system of claim 6, wherein the control signals comprise at least one selection signal configured to select between the one of the primary memory locations and the one of the spare memory locations.

10. The semiconductor memory system of claim 6, wherein the address decoder of each of the semiconductor memory devices is configured so that, if the selected one of the memory locations is one of the spare memory locations, the memory location address identifies the one of the spare memory locations.

11. The semiconductor memory system of claim 6, wherein the memory controller is configured to:
   identify for replacement at least one of the primary memory locations of at least one of the semiconductor memory devices; and
   access at least one of the spare memory locations of the at least one of the semiconductor memory devices as at least one replacement memory location for the at least one of the primary memory locations.

12. The semiconductor memory system of claim 11, wherein the memory controller is further configured to:
write data to the at least one of the primary memory locations and the at least one of the spare memory locations.

13. The semiconductor memory system of claim 11, wherein the memory controller is further configured to:
read data from the at least one of the primary memory locations; and
write the data to the at least one of the spare memory locations before accessing the at least one of the spare memory locations as the at least one replacement memory location.

14. The semiconductor memory system of claim 13, wherein:
each of the semiconductor memory devices comprises a dynamic random access memory;
the memory controller is configured to determine if the at least one of the primary memory locations comprises one of a single primary memory location, a row of primary memory locations, a column of primary memory locations, and a bank of primary memory locations; and
the at least one replacement memory location comprises one of a single spare memory location, a spare memory row, a spare memory column, and a spare memory bank.

15. A method for accessing a memory location of a semiconductor memory device, the method comprising:
receiving a memory location address for one of a plurality of memory locations of the semiconductor memory device, wherein the plurality of memory locations comprises a plurality of primary memory locations and a plurality of spare memory locations;
processing the memory location address to select the one of the memory locations;
receiving control signals for the semiconductor memory device; and
processing the control signals to determine whether the selected one of the memory locations is one of the primary memory locations or one of the spare memory locations, and to provide access to the selected one of the memory locations via data lines.

16. The method of claim 15, wherein:
the semiconductor memory device comprises a dynamic random access memory; and
the control signals comprise at least one of a row address select signal, a column address select signal, an output enable signal and a write enable signal.

17. The method of claim 15, wherein the control signals comprise at least one selection signal configured to select between the one of the primary memory locations and the one of the spare memory locations.

18. The method of claim 15, further comprising:
if the selected one of the memory locations is one of the spare memory locations, identifying the one of the spare memory locations from the memory location address.

19. The method of claim 15, further comprising:
generating the memory location address and the control signals.

20. The method of claim 19, further comprising:
identifying for replacement at least one of the primary memory locations of the semiconductor memory device; and
accessing at least one of the spare memory locations of the semiconductor memory device as at least one replacement memory location for the at least one of the primary memory locations.

21. The method of claim 20, further comprising:
writing data to the at least one of the primary memory locations and the at least one of the spare memory locations.

22. The method of claim 20, further comprising:
reading data from the at least one of the primary memory locations; and
writing the data to the at least one of the spare memory locations before accessing the at least one of the spare memory locations as the at least one replacement memory location.

23. The method of claim 22, further comprising:
determining if the at least one of the primary memory locations comprises one of a single primary memory location, a row of primary memory locations, a column of primary memory locations, and a bank of primary memory locations of a dynamic random access memory;
wherein the at least one replacement memory location comprises one of a single spare memory location, a spare memory row, a spare memory column, and a spare memory bank.

24. The method of claim 15, further comprising determining a range of each defect causing data errors.

25. The method of claim 24, further comprising selecting spare memory locations for replacing affected primary memory locations as a result of determining the range.

26. The method of claim 15, wherein a number of the data lines is equivalent to a number of storage bits for each of the memory locations.

27. The method of claim 15, further comprising writing both an affected primary memory location and an associated replacement memory location in order to continue servicing read requests from the affected primary memory locations until a copy operation is complete.

* * * * *